United States Patent [19]

Petersen

[11] Patent Number: 6,028,899
[45] Date of Patent: Feb. 22, 2000

[54] SOFT-OUTPUT DECODING TRANSMISSION SYSTEM WITH REDUCED MEMORY REQUIREMENT

[75] Inventor: Jurgen Petersen, Nürnberg, Germany

[73] Assignee: U.S. Philips Corporation, New York, N.Y.

[21] Appl. No.: 08/666,498

[22] PCT Filed: Oct. 24, 1995

[86] PCT No.: PCT/IB95/00912

§ 371 Date: Jun. 25, 1996

§ 102(e) Date: Jun. 25, 1996

[87] PCT Pub. No.: WO96/13105

PCT Pub. Date: May 2, 1996

[51] Int. Cl.[7] .................................................. H04L 27/06
[52] U.S. Cl. ............................ 375/341; 375/262; 371/43
[58] Field of Search ............................ 375/341, 253, 375/343, 222, 229, 262, 266, 265; 371/43, 46

[56] References Cited

U.S. PATENT DOCUMENTS

| | | | |
|---|---|---|---|
| 4,998,253 | 3/1991 | Ohashi et al. ............................ | 371/43 |
| 5,208,816 | 5/1993 | Seshardi et al. ............................ | 371/43 |
| 5,331,665 | 7/1994 | Busschaert et al. ............................ | 371/43 |
| 5,406,613 | 4/1995 | Peponides et al. ............................ | 375/341 |
| 5,414,738 | 5/1995 | Bienz ............................ | 375/341 |
| 5,537,444 | 7/1996 | Nill et al. ............................ | 375/341 |
| 5,586,128 | 12/1996 | Chen ............................ | 375/341 |

*Primary Examiner*—Wellington Chin
*Assistant Examiner*—Congvan Tran

[57] ABSTRACT

A variant of the symbol-by-symbol MAP algorithm only stores the backwards state metric in each $L^{th}$ step, thereby reducing the memory requirement for the backward metric by a factor of L, where L is the influence length of the convolutional code. The results can be transferred to a sub-optimum algorithm which utilizes log-likelihood ratios. In that case, it is possible to have a further saving of memory and computational effort when soft-output values are only needed for selected bits. The soft-output algorithm may then be restricted to the number of soft-output bits, and the conventional Viterbi algorithm is used for the remaining bits.

15 Claims, 7 Drawing Sheets

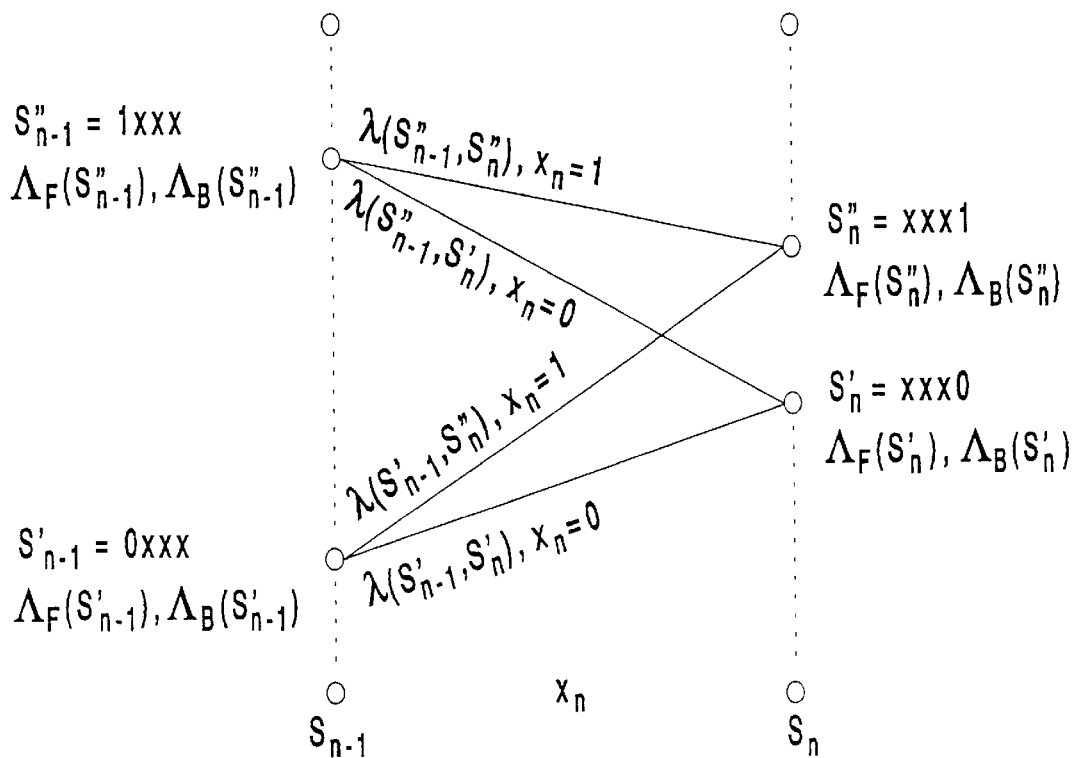

$$\Lambda_F(S'_n) = \Lambda_F(S'_{n-1}) \cdot \lambda(S'_{n-1}, S'_n) + \Lambda_F(S''_{n-1}) \cdot \lambda(S''_{n-1}, S'_n)$$

$$\Lambda_F(S''_n) = \Lambda_F(S'_{n-1}) \cdot \lambda(S'_{n-1}, S''_n) + \Lambda_F(S''_{n-1}) \cdot \lambda(S''_{n-1}, S''_n)$$

$$\Lambda_B(S'_{n-1}) = \Lambda_B(S'_n) \cdot \lambda(S'_{n-1}, S'_n) + \Lambda_B(S''_n) \cdot \lambda(S'_{n-1}, S''_n)$$

$$\Lambda_B(S''_{n-1}) = \Lambda_B(S'_n) \cdot \lambda(S''_{n-1}, S'_n) + \Lambda_B(S''_n) \cdot \lambda(S''_{n-1}, S''_n)$$

FIG. 4 comparison of computation effort

| viterbi algorithm | suboptimum soft output algorithm |
|---|---|
| forward recursion<br>path memory<br>incl. bit decision | backward recursion<br>forward recursion<br>calculation of soft output |
| effort 100% | effort 200% |

FIG. 10a simplifications

| optimum algorithm | suboptimum algorithm |
|---|---|
| likelihoods | log-likelihood values |
| multiplication | addition |
| addition | maximization |
|  | reduction of memory locations is maintained |
|  | forward recursion as with the Viterbi algorithm |
| maximum likelihood symbol estimate (minimization of the bit error probability) | maximium likelihood sequence estimate (maximization of bit error probability) |

FIG. 10b

SOFT-OUTPUT DECODING TRANSMISSION SYSTEM WITH REDUCED MEMORY REQUIREMENT

The invention relates to digital transmission systems and, more particularly, a radio a decoding device for forming a decoded digital signal from a received signal via an estimate for the probability with which the respective symbol was sent, the estimate being assigned to the respective symbols of the decoded digital signal, forward state metrics and backward state metrics to be stored being used for calculating the estimates.

BACKGROUND OF THE INVENTION

The decoding of convolutional codes with soft-input and soft-output values is often performed according to the principle of the symbol-by-symbol MAP algorithm (MAP= Maximum A posteriori Probability). The a posteriori probability for the decoded symbols is maximized subject to the received sequence. The symbol-by-symbol MAP decoding algorithm can be realized by the trellis diagram of the convolutional code when a forward and backward recursion is used. Both the forward recursion and the backward recursion are very similar to the Viterbi algorithm but for the recursion direction. The accumulated metrics calculated during the backward recursion are to be stored, because they are necessary in the forward recursion for calculating the soft-output values. The memory requirement for this is $N.2^{L-1}$ words (in currently customary fixed point digital signal processors (DSP's) a word usually comprises 16 bits), where N is the block length and L the influence length of the convolutional code. Typical values for L lie in the range [5, ... 7]. Already with moderate block lengths N of several hundred bits, this implies a large memory requirement which cannot be satisfied in currently available digital signal processors. In view of the backward recursion and the storage of the metrics, the algorithm is primarily suitable for signal sequences which have a block structure. The exact symbol-by-symbol MAP algorithm is basically unsuitable for fixed point DSP's, because the algorithm needs as soft-input values probabilities whose combinations in the algorithm (multiplication and addition) will rapidly lead to numerical problems. Therefore, a sub-optimum variant is to be used in currently available fixed point DSP's, which variant uses either logarithmic probabilities or so-called log-likelihood ratios as soft-input values while the combinations in the algorithm then consist of additions and maximization.

SUMMARY OF THE INVENTION

It is an object of the invention to reduce the memory requirement of the decoding device.

This object is achieved in that the backward state metrics are stored only in each $L^{th}$ step, where L is the influence length of the convolutional code used in the decoding device.

This object is also achieved in that the decoding device comprises means for storing the backward state metrics only in each $L^{th}$ step, where L is the influence length of the convolutional code used in the decoding device.

The invention comprises reducing the necessary memory requirement for the accumulated metrics from the backward recursion by the factor L, by modifying the base algorithm already known. This holds both for the exact and for the sub-optimum algorithm. For the sub-optimum algorithm it is possible to achieve a further saving on both memory requirement and computation effort if soft-output values are needed only for part of the bits of a block. These bits may then be re-sorted at the beginning and/or end of a block, so that there is then the possibility of limiting the whole soft-output algorithm to only these bits. For the remaining bits, the storage of the accumulated metrics of the backward recursion and also the backward recursion itself may be omitted. Instead, a survivor or path memory is to be used during the forward recursion, which corresponds to the conventional Viterbi algorithm and requires only $N.2^{L-1}/16$ words of memory locations.

The invention is based on a transmission system which comprises the components of binary source, convolutional encoder, channel and convolutional decoder. More particularly, the channel is to contain not only the transmitting and receiving-end components such as a modulator and a demodulator, but also a device that estimates the probabilities $P(\hat{u}_{nm})$ with which the symbols $\hat{u}_{nm}$ were sent, or a magnitude derived therefrom, such as logarithmic probabilities $\log P(\hat{u}_{nm})$ or log-likelihood ratios $\log(P(\hat{u}_{nm}=1)/P(\hat{u}_{nm}=))$.

The binary source generates binary vectors $\underline{x}=(x_1, x_2, \ldots, x_{n-L+1}, x_{N-L+2}=0, \ldots, x_N=0)$ of length N, with $x_i \in \{0,1\}$, where the last L−1 bits (tail bits) have a zero value, so that the encoder and decoder change to the zero state after each block. The convolutional encoder generates from each input symbol $x_n$ an output symbol $u_n = u_{n1}, \ldots U_{nM}$) of length M, with $u_{nm} \in \{0,1\}$, so that the vector $\underline{u}=(u_{11}, \ldots, u_{1M}, \ldots, u_{nm}, \ldots, u_{N1}, \ldots, U_{NM})$ results therefrom. The discrete-time channel model produces an estimate $g_{nm}=g(\hat{u}_{nm})=P(\hat{u}_{nm})$ for the probability with which the symbol $\hat{u}_{nm}$ was sent. The convolutional decoder is to produce for each decoded symbol $x_n$ an estimate $q_a=q(\hat{x}_n)$ for the probability $P(\hat{x}_n|\underline{\hat{u}})$ with which the symbol $\hat{x}_n$ was sent. To avoid scaling problems, the probability ratio $\bar{q}_n$ as shown in equation 1 is generally used:

$$\bar{q}_n = P(\hat{x}_n=1|\underline{\hat{u}})/P(\hat{x}_n=0|\underline{\hat{u}}) \tag{1}$$

Since the algorithm was used for convolutional coded symbol sequences, the generation of such symbol sequences will be briefly discussed (convolutional encoder). FIG. 2 shows the circuit of a ½ rate convolutional encoder for a convolutional code having the influence length L (memory= L−1). The states of the convolutional code which are used both in the encoder and in the decoder are to be referenced $S_n$ and are formed by the L−1 previous input symbols $S_{n-1}=(x_{n-L+1}, \ldots, x_{n-2}, x_{n-1}); S_n=(x_{n-L+2}, \ldots, x_{n-1}, x_n)$ respectively.

During the coding process in step n, the encoder changes from the initial state $S_{n-1}$ when the signal $x_n$ is input, to the next state $S_n$ and then produces the M-position symbol $u_n=(u_{n1}, \ldots, u_{nM})$.

In the following are described the separate steps for the exact algorithm which are necessary for calculating the soft-output values.

In step 1, which relates to the calculation of the branch metrics, the branch metric $\lambda(S_{n-1}, S_n)$ is calculated for each state transition (branch) beginning in state $S_{n-1}$ and ending in state $S_n$ from the estimated probabilities $P(\hat{u}_{nm})$ of the receiving symbols $\hat{u}_{nm}$ in accordance with equation 2:

$$\lambda(S_{n-1}, S_n) = \prod_{m=1}^{M} P(\hat{u}_{nm}) = \prod_{m=1}^{M} g_{nm}$$

In step 2 is effected the recursive calculation of the backward state metrics ($\Lambda_B(S_n)$) for each step n beginning with n=N up to step n=L+1 in accordance with equation 3:

$\Lambda_B(S_{n-1})=\Lambda_B(S'_n)\cdot\lambda(S_{n-1},S'_n)+\Lambda_B(S''_n)\cdot\lambda(S_{n-1},S''_n)$ for $n=N, N-1, \ldots, L+1$ Herein, $S'_n$, $S''_n$ are states of the convolutional decoder which precede the state $S_{n-1}$ in the backward recursion for $x_n=0(S'_n)$ and $x_n=1(S''_n)$, respectively. Before the beginning of the backward recursion in step n=N, the backward state metrics $\Lambda_B(S_N)$ are to have initial values; that is to say, $\Lambda_B(S_N=0)$ the "one" value and all the other state metrics $\Lambda_B(S_N\neq0)$ the "zero" value. During the backward recursion, the $2^{L-1}$ backward state metrics $\Lambda_B(S_n)$ are stored in each $L^{th}$ step.

In step 3 is effected a recursive calculation of the forward state metrics $\Lambda_F(S_n)$ for each step n, beginning with n=1 up to step n=N in accordance with equation 4:

$\Lambda_F(S_n)=\Lambda_F(S'_{n-1})\cdot\lambda(S'_{n-1},S_n)+\Lambda_F(S''_{n-1})\cdot\lambda(S''_{n-1},S_n)$
  for $n=1, 2, \ldots, N$ Herein, $S'_{n-1}$, $S''_{n-1}$ are states of the convolutional decoder which precede the state $S_n$ in the forward recursion for $x_{n-L+1}=0(S'_{n-1})$ and $x_{n-L+1}=1(S''_{m-1})$, respectively.

Before the beginning of the forward recursion in step n=1, the forward state metrics $\Lambda_F(S_o)$ are to obtain initial values; that is $\Lambda_F(S_o=0)$ the "one" value, and all the other state metrics $\Lambda_F(S_o\neq0)$ the "zero" value.

In step 4, the calculation of the soft-output values is made. During the forward recursion are then calculated in each $L^{th}$ step i.e. for n=L, 2L, 3L, ... etc. the soft-output values $\bar{q}_n$ for the previous L symbols $\hat{x}_n$ to $\hat{x}_{n-L+1}$; that is, for the symbols $\hat{x}_n$ to $\hat{x}_{n-L+2}$ in accordance with equation (5):

$$\bar{q}_{n-v} = \frac{P(\hat{x}_{n-v} = 1 \mid \hat{u})}{P(\hat{x}_{n-v} = 0 \mid \hat{u})}$$

$$= \frac{\sum_{S_n \mid x_{n-v}=1} \Lambda_F(S_n) \cdot \Lambda_B(S_n)}{\sum_{S_n \mid x_{n-v}=0} \Lambda_F(S_n) \cdot \Lambda_B(S_n)} \quad \text{for } v = 0, \ldots, L-2$$

and for the symbol $\hat{x}_{n-L+1}$ in accordance with equation 6:

$$\bar{q}_{n-L+1} = \frac{P(\hat{x}_{n-L+1} = 1 \mid \hat{u})}{P(\hat{x}_{n-L+1} = 0 \mid \hat{u})}$$

$$= \frac{\sum_{S_{n-1} \mid x_{n-L+1}=1} \Lambda_F(S_{n-1}) \cdot \lambda(S_{n-1}, S_n) \cdot \Lambda_B(S_n)}{\sum_{S_{n-1} \mid x_{n-L+1}=0} \Lambda_F(S_{n-1}) \cdot \lambda(S_{n-1}, S_n) \cdot \Lambda_B(S_n)}$$

The sub-optimum algorithm will be described in the following. The separate steps for calculating the soft-output values for the sub-optimum algorithm correspond to those of the exact algorithm, except that probabilities in the formulas are to be replaced by logarithmic probabilities or log-likelihood ratios, multiplications by additions and additions by maximization.

In step 1, for calculating the branch metrics, the branch metric $\lambda(S_{n-1}, S_n)$ is calculated for each state transition (branch) which commences in state $S_{n-1}$ and ends in state $S_n$ from the log-likelihood ratios $g_{nm}=g(\hat{u}_{nm})=\log(P(\hat{u}_{nm})=1)/P(\hat{u}_{nm})=0))$ of the received symbols $\hat{u}_{nm}$ in accordance with equation 7:

$$\lambda(S_{n-1}, S_n) = \sum_{m=1}^{M} c(\hat{u}_{nm}) \cdot g_{nm} \text{ with } \begin{cases} c(\hat{u}_{nm} = 0) = -1 \\ c(\hat{u}_{nm} = 1) = 1 \end{cases}$$

In step 2, for determining the backward recursion, a recursive calculation is performed of the backward state metrics $\Lambda_B(S_n)$ for each step n beginning with n=N up to the step n=L+1 in accordance with equation 8:

$\Lambda_B(S_{n-1})=max\ (\Lambda_B(S'_n)+\lambda(S_{n-1},S'_n), \Lambda_B(S''_n)+\lambda(S_{n-1},S''_n))$ for $n=N, N-1, \ldots, L+1$ Herein, $S'_n$, $S''_n$ are states of the convolutional decoder which precede the state $S_{n-1}$ during the backward recursion for $x_n=0(S'_n)$ or $x_n=1(S''_n)$, respectively. Before the beginning of the backward recursion in step n=N, the backward state metrics $\Lambda_B(S_N)$ are to obtain the initial values; that is to say, $\Lambda_B(S_N=0)$ the "zero" value and all the other state metrics $\Lambda_B(S_N\neq0)$ a larger negative value (for example –10,000). During the backward recursion, the $2^{L-1}$ backward state metrics $\Lambda_B(S_n)$ are stored in each $L^{th}$ step.

In step 3, for determining the forward recursion, the recursive calculation is made of the forward state metrics $\Lambda_F(S_n)$ for each step n, in accordance with equation 9, beginning with n=1 up to the step n=N.

$\Lambda_F(S_n)=max\ (\Lambda_F(S'_{n-1})+\lambda(S'_{n-1},S_n), \Lambda_F(S''_{n-1})+\lambda(S''_{n-1},S_n))$ for $n=1, 2, \ldots, N$ Herein, $S'_{n-1}$, $S''_{n-1}$ are states of the convolutional decoder which precede the state $S_n$ during the forward recursion for $x_{n-L+1}=0(S'_{n-1})$ or $x_{n-L+1}=1(S''_{n-1})$. Before the beginning of the forward recursion in step n=1, the forward state metrics $\Lambda_F(S_o)$ are to obtain initial values; that is to say, $\Lambda_F(S_o=0)$ the "zero" value and all the other state metrics $\Lambda_F=S_o \neq 0$) a larger negative value (for example –10,000).

In step 4, for calculating the soft-output values, the soft-output values $\bar{q}_n$ for the preceding L symbols $\hat{x}_n$ to $\hat{x}_{n-L+1}$ are calculated during the forward recursion in each $L^{th}$ step i.e. for n=L, 2L, 3L, ... etc.; that is to say, for the symbols $\hat{x}_n$ to $\hat{x}_{n-L+2}$ in accordance with equation (10):

$$\bar{q}_{n-v} = \alpha \cdot \log \frac{P(\hat{x}_{n-v} = 1 \mid \hat{u})}{P(\hat{x}_{n-v} = 0 \mid \hat{u})}$$

$$= \max_{S_n \mid x_{n-v}=1} (\Lambda_F(S_n) + \Lambda_B(S_n)) -$$

$$\max_{S_n \mid x_{n-v}=0} (\Lambda_F(S_n) + \Lambda_B(S_n))$$

for $v = 0, \ldots, L-2$ and for the symbol $\hat{x}_{n-L+1}$ in accordance with equation (11):

$$\bar{q}_{n-L+1} = \alpha \cdot \log \frac{P(\hat{x}_{n-L+1} = 1 \mid \hat{u})}{P(\hat{x}_{n-L+1} = 0 \mid \hat{u})}$$

$$= \max_{S_{n-1} \mid x_{n-L+1}=1} (\Lambda_F(S_{n-1}) + \lambda(S_{n-1}, S_n) + \Lambda_B(S_n)) -$$

$$\max_{S_{n-1} \mid x_{n-L+1}=0} (\Lambda_F(S_{n-1}) + \lambda(S_{n-1}, S_n) + \Lambda_B(S_n))$$

Herein, $\alpha$ is a proportionality constant. The binary symbols $\hat{x}_n$ to be decoded are implicitly represented by the sign of the soft-output values $\bar{q}_n$:

$\hat{x}_n=1$ for $\bar{q}_n \geq 0$ $\hat{x}_n=0$ for $\bar{q}_n < 0$

There may be observed that the two algorithms are "symmetrical" with respect to the forward and backward recursion; i.e. first the forward recursion can be effected by storing the forward state metrics in each $L^{th}$ step, and then the backward recursion via a calculation of the soft-output values.

In the following, the combination of the sub-optimum soft-output algorithm with the conventional Viterbi algorithm will be described:

For the sub-optimum algorithm a further saving on both the memory requirement and the calculation effort can be achieved if soft-output values are only needed for part of the bits of a block. By re-sorting the bits at the beginning and/or at the end of a block, they can be placed so that the possibility arises that the complete soft-output algorithm is limited to only these bits. For the remaining bits it is then possible to omit the storage of the accumulated metrics from the backward recursion as well as the backward recursion itself. Instead, a survivor or path memory is to be used for these bits during the forward recursion, to be able to decode the bits, which corresponds to the conventional Viterbi algorithm. This is to say that the two algorithms may be combined, because the calculation of the accumulated metrics during the forward recursion is identical for both algorithms.

If the soft-output bits occur at the end of a block i.e. if soft-output values are only to be calculated for the last $N_L$ symbols of a block, the following steps are to be executed:

1. Execution of the backward recursion of the soft-output algorithm for the last $N_L$ symbols of a block including storage of the backward state metrics in each $L^{th}$ step.
2. Application of the conventional Viterbi algorithm including survivor or path memory to the first $N-N_L$ symbols of the block.
3. Execution of the forward recursion of the soft-output algorithm for the last $N_L$ symbols of the block including a calculation of the soft-output values in each $L^{th}$ step. The forward recursion then utilizes the accumulated metrics from the conventional Viterbi algorithm of step 2 as initial values.
4. Decision on the first $N-N_L$ symbols of the block based on the information of the last $N_L$ decoded symbols and of the survivor memory, just like the conventional Viterbi algorithm.

If the soft-output bits occur at the beginning of a block i.e. if soft-output values are to be calculated only for the first $N_F$ symbols of a block, the opportunity may be seized that the conventional Viterbi algorithm, instead of being realized by a forward recursion, may as well be realized by a backward recursion. By changing the directions of recursion relative to the preceding case (soft-output values at the end of a block), there are the following steps:

1. Execution of the forward recursion of the soft-output algorithm for the first $N_F$ symbols of a block including storage of the forward state metrics in each $L^{th}$ step.
2. Application of the conventional Viterbi algorithm (realization by backward recursion) including survivor or path memory to the last $N-N_F$ symbols of the block.
3. Execution of the backward recursion for the first $N_F$ symbols of the block including a calculation of the soft-output values in each $L^{th}$ step. The backward recursion then utilizes the accumulated metrics from the conventional Viterbi algorithm of step 2 as initial values.
4. Decision on the last $N-N_F$ symbols of the block based on the information of the first $N_F$ decoded symbols and on the survivor or path memory, just like the conventional Viterbi algorithm.

If the soft-output bits occur at the beginning and at the end of a block i.e. soft-output values are to be calculated for the first $N_F$ and the last $N_L$ symbols of a block, the following steps are to be executed:

1. Execution of the backward recursion of the soft-output algorithm for the last $N_L$ symbols of a block including storage of the backward state metrics in each $L^{th}$ step.
2. Execution of the backward recursion of the soft-output algorithm for the first $N_F$ symbols of a block including the storage of the backward state metrics in each $L^{th}$ step. The backward recursion then needs to have a leader routine of about 5.L steps (without a storage of the metrics), so that secure values for the backward state metrics are available when the first part is reached.
3. Execution of the forward recursion of the soft-output algorithm for the first $N_F$ symbols of the block including a calculation of the soft-output values in each $L^{th}$ step.
4. Application of the conventional Viterbi algorithm including survivor or path memory to the middle part of the block formed by $N-N_F-N_L$ symbols. The conventional Viterbi algorithm then utilizes the accumulated metrics of the forward recursion of step 3 as initial values.
5. Execution of the forward recursion of the soft-output algorithm for the last $N_L$ symbols of the block including a calculation of the soft-output values in each $L^{th}$ step. The forward recursion then utilizes the accumulated metrics of the conventional Viterbi algorithm of step 4 as initial values.
6. Decision on the middle part of the block made of $N-N_F-N_L$ symbols based on the information of the last $N_L$ decoded symbols and of the survivor or path memory, just like the conventional Viterbi algorithm.

These and other aspects of the invention will be apparent from and elucidated with reference to the embodiments described hereinafter.

BRIEF DESCRIPTION OF THE DRAWING

In the drawings:

FIG. 4 shows a diagram with state transitions.

DETAILED DESCRIPTION OF THE DRAWING

Figure 1:
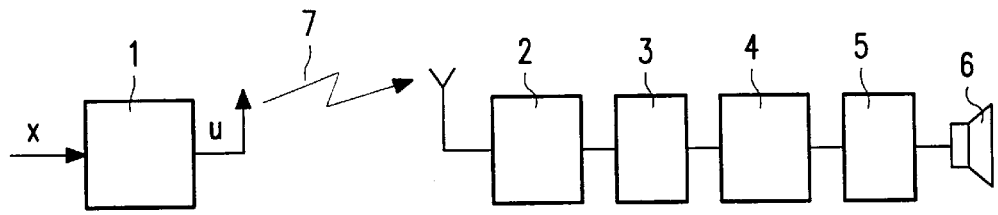
FIG. 1 shows an illustrative embodiment for a digital radio transmission system.

FIG. 1 shows a basic circuit diagram of a radio transmission system operating, for example, according to the GSM standard, in which a digital transmit signal x is transmitted in the form of a coded digital signal u by a transmitter, for example, of a radio base station. Between the transmitter 1 and a receiver 2 there is a radio transmission channel 7. The receiver has, for example, a receiving section (not further shown in the Figure) with a sample-and-hold element and an A/D converter. Furthermore, at the receiving end there are, for example, a mobile station, an equalizer 3, a decoding device 4 (channel decoder), a voice or data decoder 5 as well as a loudspeaker 6. In the illustrative embodiment shown in FIG. 1, the decoding device according to the invention is shown at the receiving end formed, for example, by a mobile station. The decoding device according to the invention, however, may also be arranged in the receiver of a radio base station.

Figure 2:
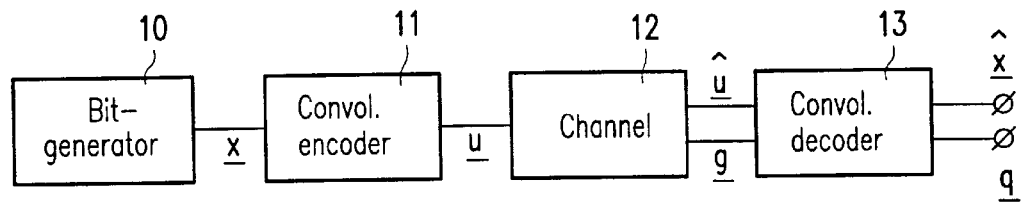
FIG. 2 shows a channel model for a digital radio transmission system.
Figure 3:
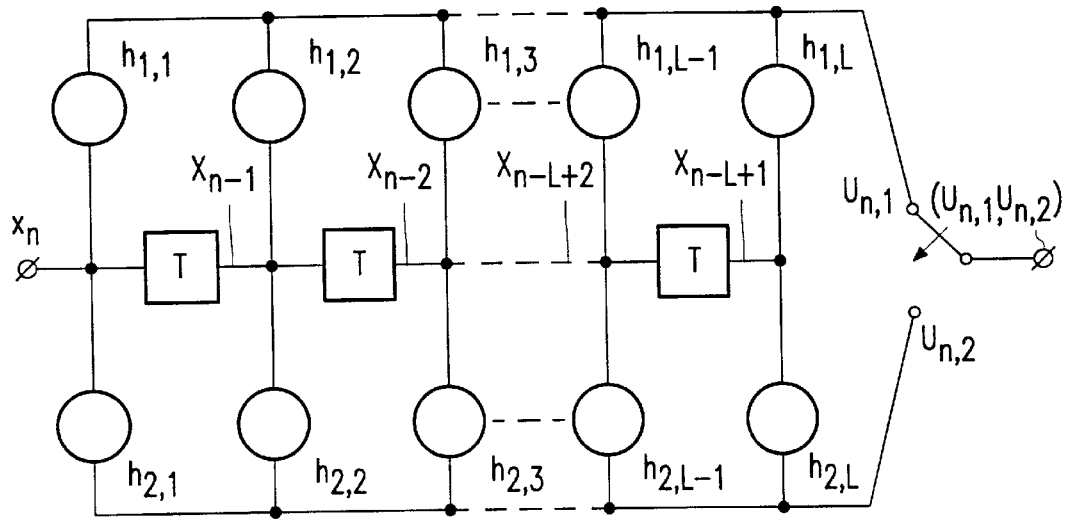
FIG. 3 shows an illustrative embodiment for a convolutional encoder.

For an explanation of the algorithm, a transmission system shown in FIG. 2 is considered. A binary source 10 generates binary vectors $\underline{x}=(x_1, x_2, \ldots, x_{N-L+1}, x_{N-L+2}=0, \ldots, x_N=0)$ of length N with $x_i \in \{0,1\}$, where the last L−1 bits have zeros (tail bits), so that the encoder 11 and decoder 13 return to zero after each block. The convolutional encoder 11 generates from each input symbol $x_n$ an output symbol $u_n=(u_{n1}, \ldots, u_{nM})$ of length M, with $U_{nm} \in \{0,1\}$, so that the vector $\underline{u}=(u_{11}, \ldots, u_{1M}, \ldots, u_{nm}, \ldots, u_{N1}, \ldots, u_{NM})$ is produced.

The discrete-time channel model is to include not only the transmission medium but also the transmitting-end and receiving-end components such as modulator, demodulator and equalizer, as appropriate. There is assumed that it produces for each symbol $\hat{u}_{nm}$ an estimate $g_{nm}=g(\hat{u}_{nm})=P(\hat{u}_{nm})$ for the probability with which the symbol $\hat{u}_{nm}$ was transmitted. The convolutional decoder is to produce for each decoded symbol $\hat{x}_n$ an estimate $q_n=q(\hat{x}_n)$ for the probability $P(\hat{x}_n|\underline{\hat{u}})$ with which the symbol $\hat{x}_n$ was transmitted. Assuming a memoryless disturbing process, the symbol-by-symbol MAP algorithm optimally satisfies this condition; that is to say, the bit error probability in the decoded output sequence is minimized and $1-q_n$ represents the estimate of the bit error probability for the decoded symbol $\hat{x}_n$.

The algorithm is based on the maximization of the a posteriori probability for $\hat{x}_n$, provided that the sequence $\underline{\hat{u}}$ was received; that is to say, $\hat{x}_n$ is to be selected for all n, so that the following holds according to equation 12:

$$P(\hat{x}_n | \underline{\hat{u}}) = \max_{x_n} P(x_n | \underline{\hat{u}})$$

To avoid scaling problems, generally the probability ratio $\bar{q}_n$ according to equation 13 is used as a soft-output value:

$$\bar{q}_n = P(\hat{x}_n=1|\hat{u})/P(\hat{x}_n=0|\hat{u})$$

With binary symbols $x_n$ which are equally likely, equation 13 may be transformed into equation 14:

$$\bar{q}_n = \frac{P(\hat{x}_n=1|\underline{\hat{u}})}{P(\hat{x}_n=0|\underline{\hat{u}})} = \frac{\sum_{\forall \underline{x}|x_n=1} P(\underline{\hat{u}}|\underline{x})}{\sum_{\forall \underline{x}|x_n=0} P(\underline{\hat{u}}|\underline{x})}$$

This is to be interpreted as follows: For each position n, all possible vectors $\underline{x}$ having the symbol $x_n=1$ on the $n^{th}$ position are run through and the probabilities $P(\underline{\hat{u}}|\underline{x})$ are formed for these vectors and summed. The same is repeated for $x_n=0$ and the ratio is formed from the two sum probabilities.

Equation 14 can be realized efficiently for all positions n while taking into account the permissible state transitions of the convolutional code by a forward and backward recursion /3,4/. The forward and backward state metrics $\Lambda_F(S_n)$ and $\Lambda_B(S_n)$ are used as subsidiary quantities which can be calculated recursively in accordance with equation 15 (cf. FIG. 4):

$$\Lambda_F(S_n)=\Lambda_F(S'_{n-1})\cdot\lambda(S'_{n-1},S_n)+\Lambda_F(S''_{n-1})\cdot\lambda(S''_{n-1},S_n)$$

$$\Lambda_B(S_{n-1})=\Lambda_B(S'_n)\cdot\lambda(S_{n-1},S'_n)+\Lambda_B(S''_n)\cdot\lambda(S_{n-1},S''_n)$$

Herein, $S_n, S_{n-1}$ are states of the convolutional decoder in step n and n−1, respectively.

$S'_{n-1}, S''_{n-1}$ are states of the convolutional decoder which precede the state $S_n$ in the forward recursion for $x_{n-L+1}=0(S'_{n-1})$ and $x_{n-L+1}=1(S''_{n-1})$, respectively.

$S'_n, S''_n$ are states of the convolutional decoder which precede the state $S_{n-1}$ during the backward recursion for $x_n=0(S'_n)$ and $x_n=1(S''_n)$, respectively.

$\lambda(S_{n-1},S_n)$ transition probability (branch metric) for the state transition from $S_{n-1}$ to $S_n$.

The branch metrics $\lambda(S_{n-1},S_n)$ are the result from the probabilities that have been estimated by, for example, the equalizer (here forming part of the channel) for the symbols $u_{n1}, \ldots, u_{nM}$ which, according to the coding standard, belong to the state transition $(S_{n-1},S_n)$ (equation 16):

$$\lambda(S_{n-1}, S_n) = \prod_{m=1}^{M} P(\hat{u}_{nm}) = \prod_{m=1}^{M} g_{nm}$$

Via the forward and backward state metrics, the soft-output values $\bar{q}_n$ appear from equation 17:

$$\bar{q}_n = \frac{P(\hat{x}_n=1|\underline{\hat{u}})}{P(\hat{x}_n=0|\underline{\hat{u}})} = \frac{\sum_{S_n|x_n=1} \Lambda_F(S_n)\cdot\Lambda_B(S_n)}{\sum_{S_n|x_n=0} \Lambda_F(S_n)\cdot\Lambda_B(S_n)}$$

The states $S_n$ may be represented in binary notation by the binary symbols $x_n$:

$S_{n-1}=(x_{n-L+1}, \ldots, x_{n-2}x_{n-1}); S_n=(x_{n-L+2}, \ldots, x_{n-1}, x_n)$ respectively The summation of all the states $S_n|x_n=1$ means that only those states are to be summed that contain the symbol $x_n=1$. This accordingly holds for $S_n|x_n=0$. The individual steps for calculating the soft-output values $\bar{q}_n$ according to equation 17 thus look as follows:

1. Calculation of the branch metrics $\lambda(S_{n-1},S_n)$ from the channel(equalizer)-estimated probabilities $g_{nm}$ of the received symbols $\hat{u}_{nm}$ in accordance with equation 16.
2. Recursive calculation and storage of the backward state metrics $\Lambda_B(S_n)$ in accordance with equation 15.
3. Recursive calculation of the forward state metrics $\Lambda_F(S_n)$ in accordance with equation 4.
4. Calculation of the soft-output values $\bar{q}_n$ in accordance with equation 17.

Discarding the numerical problems which occur when probabilities are multiplied, the backward state metrics are to be stored for this algorithm and saved until the calculation of the soft-output values; that is to say, $N.2^{L-1}$ memory locations are to be reserved for this purpose if N is the block length and L the influence length of the convolutional code. Then there is to be shown that the backward state metrics $\Lambda_B(S_k)$ are to be stored only in each $L^{th}$ step; i.e. the memory requirement can be reduced by the factor L. If the summation in equation 17 is considered of $S_n|x_n=1$ and $S_n|x_n=0$ in the next step n+1, that is, if one tries to replace the magnitudes $\Lambda_F(S_n)$ and $\Lambda B(S_n)$ in the expressions by $\Lambda_F(S_{n+1})$ and $\Lambda_B(S_{n+1})$, it may be shown by an industrious piece of work that the coherence shown in the following equation 18 holds:

$$\bar{q}_n = \frac{\sum_{S_n|x_n=1} \Lambda_F(S_n) \cdot \Lambda_B(S_n)}{\sum_{S_n|x_n=0} \Lambda_F(S_n) \cdot \Lambda_B(S_n)} = \frac{\sum_{S_{n+1}|x_n=1} \Lambda_F(S_{n+1}) \cdot \Lambda_B(S_{n+1})}{\sum_{S_{n+1}|x_n=0} \Lambda_F(S_{n+1}) \cdot \Lambda_B(S_{n+1})}$$

that is to say, by appropriate summation in step n+1, not only the soft-output value for the current symbol $x_{n+1}$, but also for the preceding symbol $x_n$ can be calculated. This result may be generalized for the L-2 previous symbols (equation 19):

$$\bar{q}_{n-v} = \frac{P(\hat{x}_{n-v} = 1 | \hat{u})}{P(\hat{x}_{n-v} = 0 | \hat{u})}$$

$$= \frac{\sum_{S_n|x_{n-v}=1} \Lambda_F(S_n) \cdot \Lambda_B(S_n)}{\sum_{S_n|x_{n-v}=0} \Lambda_F(S_n) \cdot \Lambda_B(S_n)} \quad \text{for } v = 0, \ldots, L-2$$

The soft-output value of the symbol $x_{n-L+1}$ which no longer occurs in the state $S_n$ but in the state $S_{n-1}$, can be calculated during the forward recursion in step n as follows (equation 20):

$$\bar{q}_{n-L+1} = \frac{P(\hat{x}_{n-L+1} = 1 | \hat{u})}{P(\hat{x}_{n-L+1} = 0 | \hat{u})}$$

$$= \frac{\sum_{S_{n-1}|x_{n-L+1}=1} \Lambda_F(S_{n-1}) \cdot \lambda(S_{n-1}, S_n) \cdot \Lambda_B(S_n)}{\sum_{S_{n-1}|x_{n-L+1}=0} \Lambda_F(S_{n-1}) \cdot \lambda(S_{n-1}, S_n) \cdot \Lambda_B(S_n)}$$

Thus, it is possible via equations 19 and 20 to calculate L soft-output values without additional computation effort when the forward recursion is calculated in step n. Equation (9) makes an indirect calculation $\Lambda_B(S_{n-1})$ from $\Lambda_B(S_n)$, it is true, but the intermediate quantities $\Lambda_F(S_{n-1}) \cdot \lambda(S_{n-1}, S_n)$ must be formed for the forward recursion anyway, so that the computation effort is as great as in equation 19.

Incidentally, a further interesting coherence which can be derived from equation 18 should be pointed out. There is not only equality between the two terms, but also between the numerators and denominators of the two terms, so that the addition of a numerator and denominator equation leads to the following result:

$$\sum_{S_n} \Lambda_F(S_n) \cdot \Lambda_B(S_n) = \sum_{S_{n+1}} \Lambda_F(S_{n+1}) \cdot \Lambda_B(S_{n+1}) = C$$

The sum of the products of the forward and backward state metrics is equally large in each step n. Therefore, it is sufficient for the calculation of the soft-output values in equations 19 and 20 to calculate e.g. only the numerator. The denominator is then the difference between C and the numerator.

A disadvantage of this algorithm is that probabilities are to be multiplied, which generally rapidly leads to numerical problems. This disadvantage is usually encountered by using log-likelihood ratios according to equation 22:

$$g_{nm} = g(\hat{u}_{nm}) = \log \frac{P(\hat{u}_{nm} = 1)}{P(\hat{u}_{nm} = 0)}$$

Multiplications are then changed into additions. The problem of adding together probabilities can substantially be solved by a maximization of the logarithms; that is to say, $\log(P_1 + P_2) \approx \max(\log P_1, \log P_2)$. The largest error occurs for $P_1 = \log P_2$ and its value is log2.

If the two operations of addition and multiplication are compared with maximization and addition, the same calculation standards are determined (isomorphism). Especially the associative and distributive law also holds for maximization and addition.

If, therefore, log-likelihood ratios instead of probabilities are used, equations 15 to 21 will further hold if the additions are replaced by maximization and the multiplications by additions. The most important equations are summarized here once again.

Herein, $\alpha$ is the proportionality constant. Also equation (10) accordingly holds; that is to say, the maximum of the sum of forward and backward state metrics is equally large in each step n.

$$\lambda(S_{n-1}, S_n) = \sum_{m=1}^{M} c(\hat{u}_{nm}) \cdot g_{nm} \text{ with } \begin{cases} c(\hat{u}_{nm} = 0) = -1 \\ c(\hat{u}_{nm} = 1) = 1 \end{cases}$$

$$\Lambda_F(S_n) = \max(\Lambda_F(S'_{n-1}) + \lambda(S'_{n-1}, S_n), \Lambda_F(S''_{n-1}) + \lambda(S''_{n-1}, S_n))$$

$$\Lambda_B(S_{n-1}) = \max(\Lambda_B(S'_n) + \lambda(S_{n-1}, S'_n), \Lambda_B(S''_n) + \lambda(S_{n-1}, S''_n))$$

$$\bar{q}_{n-v} = \alpha \cdot \log \frac{P(\hat{x}_{n-v} = 1 | \hat{u})}{P(\hat{x}_{n-v} = 0 | \hat{u})}$$

$$= \max_{S_n|x_{n-v}=1} (\Lambda_F(S_n) + \Lambda_B(S_n)) - \max_{S_n|x_{n-v}=0} (\Lambda_F(S_n) + \Lambda_B(S_n))$$

for $v = 0, \ldots, L-2$ $$\bar{q}_{n-L+1} = \alpha \cdot \log \frac{P(\hat{x}_{n-L+1} = 1 | \hat{u})}{P(\hat{x}_{n-L+1} = 0 | \hat{u})}$$

$$= \max_{S_{n-1}|x_{n-L+1}=1} (\Lambda_F(S_{n-1}) + \lambda(S_{n-1}, S_n) + \Lambda_B(S_n)) - \max_{S_{n-1}|x_{n-L+1}=0} (\Lambda_F(S_{n-1}) + \lambda(S_{n-1}, S_n) + \Lambda_B(S_n))$$

$$\max_{S_n}(\Lambda_F(S_n) + \Lambda_B(S_n)) = \max_{S_{n+1}}(\Lambda_F(S_{n+1}) + \Lambda_B(S_{n+1})) = C$$

This result is understandable when one realizes that the maximum value of equation (13) represents the sum of all the branch metrics of the maximum probability path in the trellis diagram, where $\Lambda_F(S_n)$ contains the first n and $\Lambda_B(S_n)$ contains the last N-n branch metrics.

The effort of the described soft-output algorithm is about twice as high as with the conventional Viterbi algorithm, because the trellis diagram is to be worked through in forward and backward directions. The path memory and the consequent operations, however, are omitted completely. Instead, several operations for calculating the soft-output values are added.

Figure 5A:
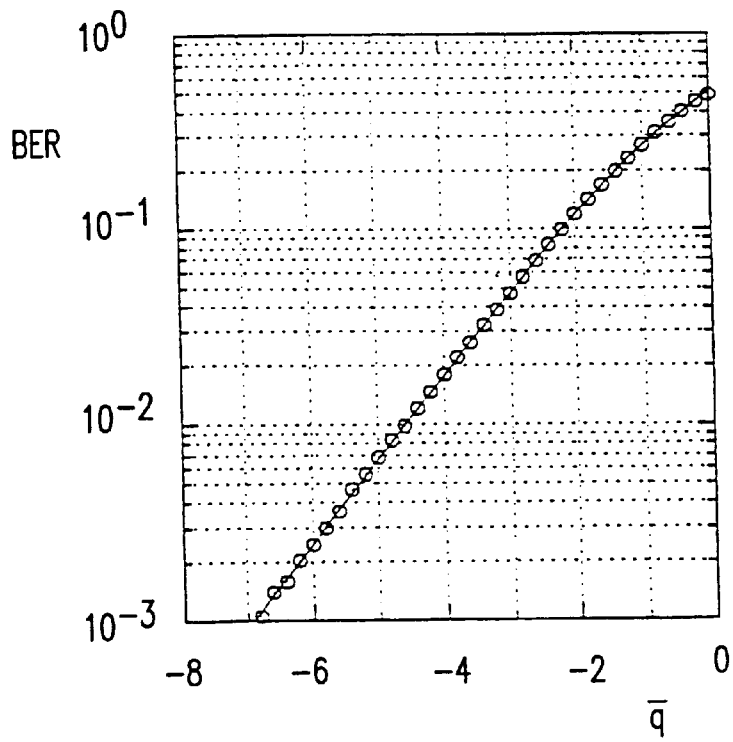
FIG. 5 shows diagrams of bit error rate (BER) plotted against the soft-output values of the convolutional decoder for a) the exact algorithm and b) the sub-optimum algorithm.
Figure 5B:
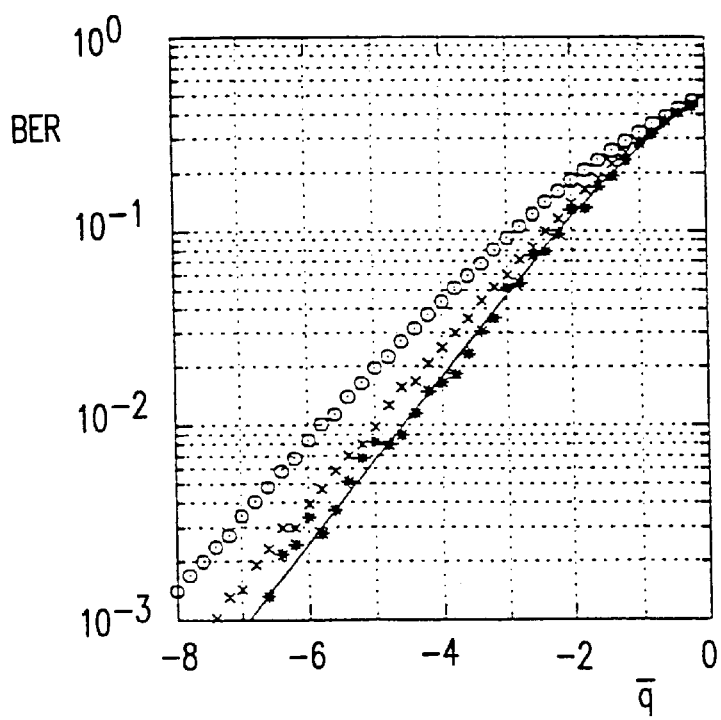

The maximization when maximum likelihood ratios are used is an approximation compared with the original algorithm. This approximation has no tangible effect on the bit error probability of the hard-decision bits, because the differences between a maximum likelihood symbol estimate and a maximum likelihood sequence estimate are not significant. Conversely, larger differences are to be expected for the soft-output values. To answer this question, a simulation is made in which a memoryless bit error source produces not only a bit error sequence but also ideal soft-output values $g'_{nm}=\log(p_{nm}/(1-p_{nm}))$, where $p_{nm}$ represents the bit error probability for the bit $\hat{u}_{nm}$. The soft-output values $\bar{q}_n$ of the convolutional decoder are then to reflect the bit error probabilities for the decoded bits. FIG. 5 shows the curve of the simulated bit error probabilities in response to the soft-output values (here log-likelihood ratios) of the convolutional decoder together with the theoretical curve. Whereas the bit error probability in the exact decoding algorithm corresponds to the theoretical curve but for minor statistical deviations, systematic deviations from the theoretical curve occur in the sub-optimum algorithm especially with small signal-to-noise ratios (S/N<3 dB). However, starting from a signal-to-noise ratio of about 4 dB, a good correspondence with the nominal curve can be established even with the sub-optimum algorithm. These differences of quality in the soft-output values, however, do not permit any direct conclusion with respect to losses to be expected in concrete applications.

When the log-likelihood values are used, the symbol-by-symbol MAP algorithm changes into a maximum likelihood sequence estimate; i.e. the hard-decision bits from the soft-output values are identical with those of the suitable Viterbi algorithm with maximum path memory. Since the calculation of the forward state metrics is identical for the two algorithms, there is an attractive possibility of combining the two algorithms if soft-output values are desired only for selected bits. For example, the bits of a voice transmission with RELP or CELP encoding have different significances, which leads to the consideration of calculating soft-output values only for the most significant bits. At any rate, it is then possible to omit storing the backward state metrics for the part of the hard-decision bits.

The combination of the algorithms turns out to be the simplest when the most significant bits are placed at the end of a block as is provided, for example, in the currently used GSM half-rate voice channel. Soft-output values are calculated there for the last encoded 25 bits of a speech block comprising 98 coded bits in all. In this case it is possible for the first 73 bits to use the conventional Viterbi algorithm (with hard decision) and use the soft-output algorithm only for the last 25 bits. With an influence length of L=7, there are then 64. ⌈25/71⌉=256 memory locations for the backward metrics. In that case the computation effort is increased by only about 30% compared with the suitable Viterbi algorithm.

If the most significant bits occur both at the beginning and at the end of a block, as occurs in the coding scheme of the GSM full-rate voice channel, the backward recursion may be limited to the front and back part of the block. For the front part of the block the backward recursion, however, is to start slightly earlier (be advanced) to obtain reliable soft-output values when the front part is reached. It should be pointed out that the decoded output sequence (hard-decision bits) and also the state sequence in the decoder are already known from the forward recursion. Therefore, at the start of the backward recursion, the start metric of the state that is to be passed through advantageously obtains the zero value, whereas all the other state metrics obtain a large negative value. This ensures that the output sequence decoded from the soft-output values corresponds to the decoded output sequence from the forward recursion; i.e. the bit error probability of the hard-decision bits remains unchanged due to the incomplete soft-output decoding.

Figure 6:
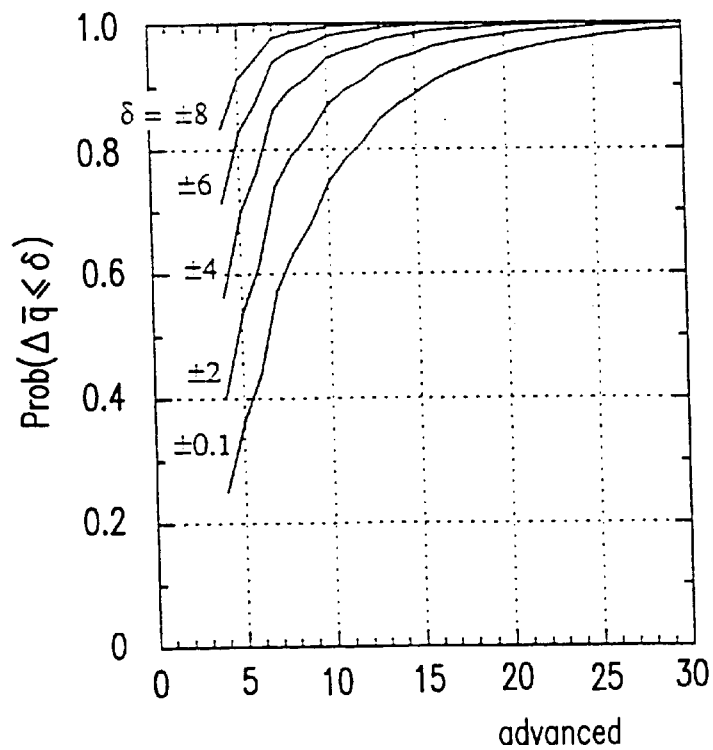
FIGS. 6 and 7 show each a diagram for demonstrating the degradation of the soft-output values in the case of partial decoding.
Figure 7:
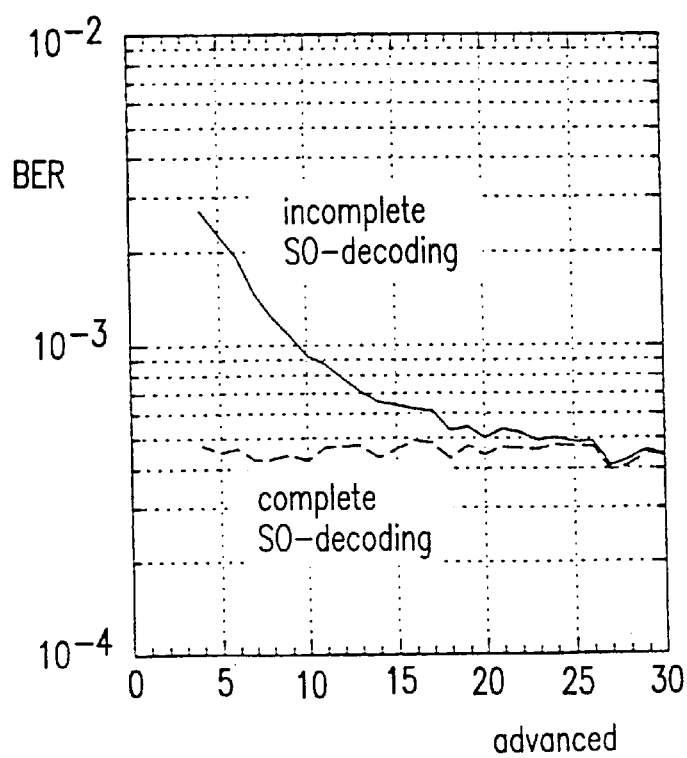
Figure 8:
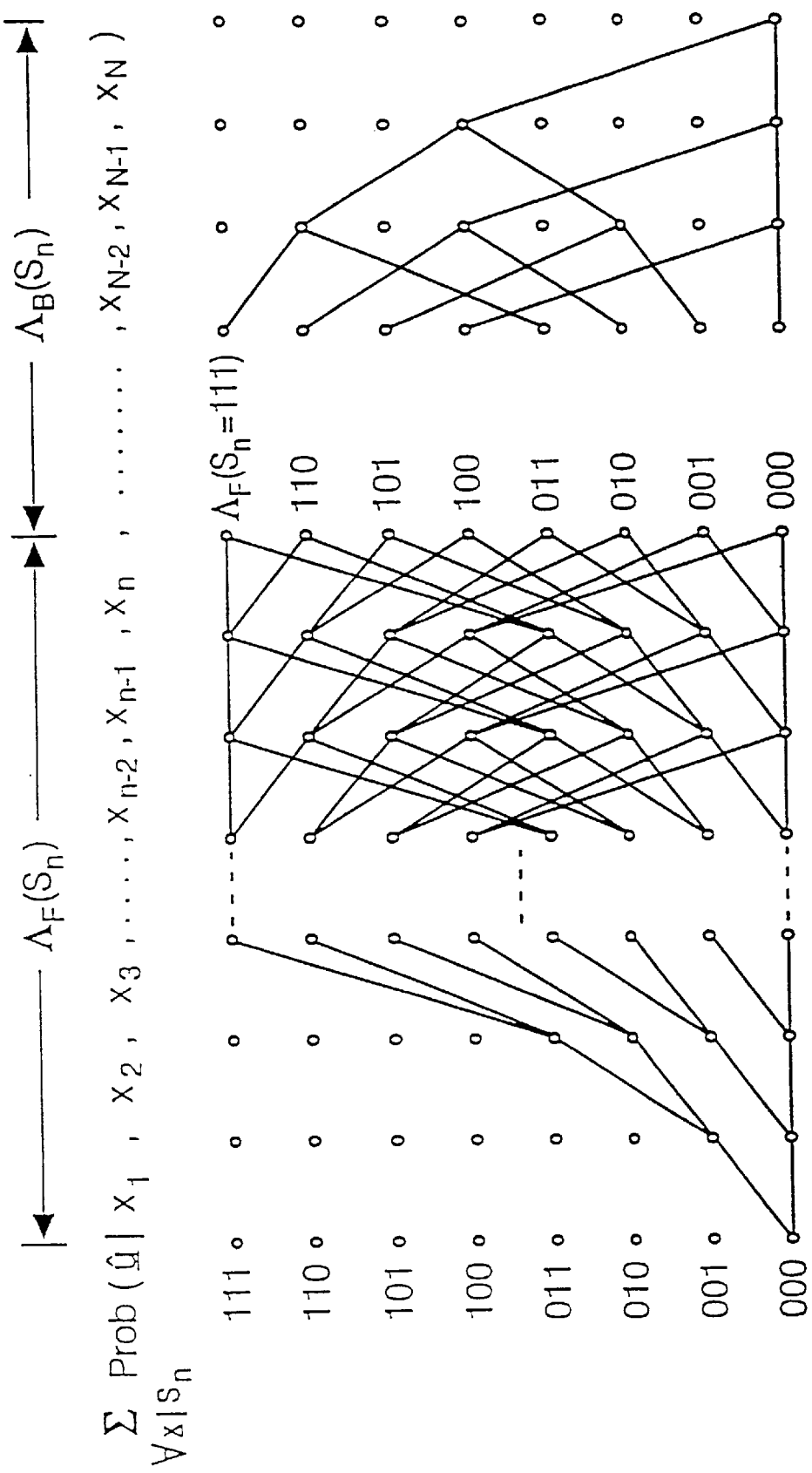
FIG. 8 shows a further diagram with state transitions, FIGS. 9a) to c) give representations for demonstrating the algorithms, and FIGS. 10a), b) give a comparison of the effort and simplifications, respectively.
Figure 9A:
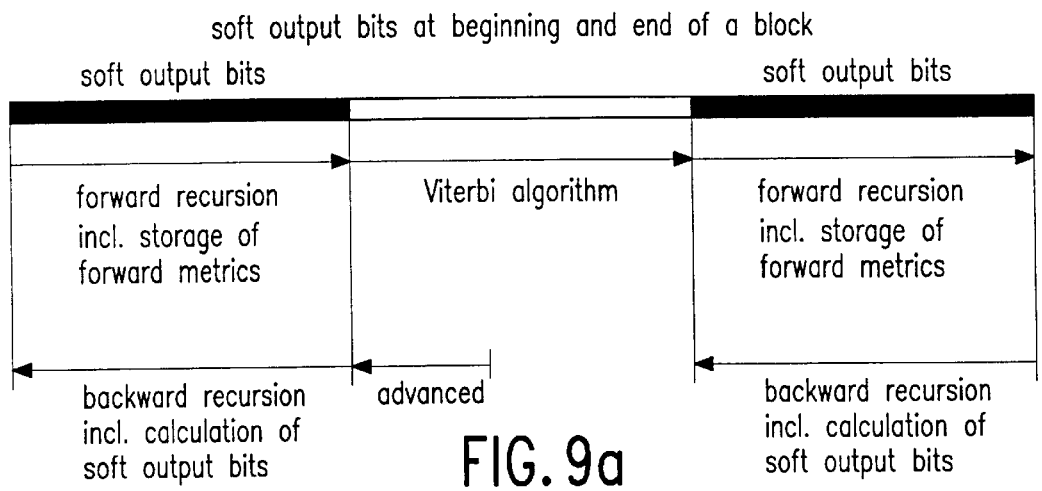
Figure 9B:
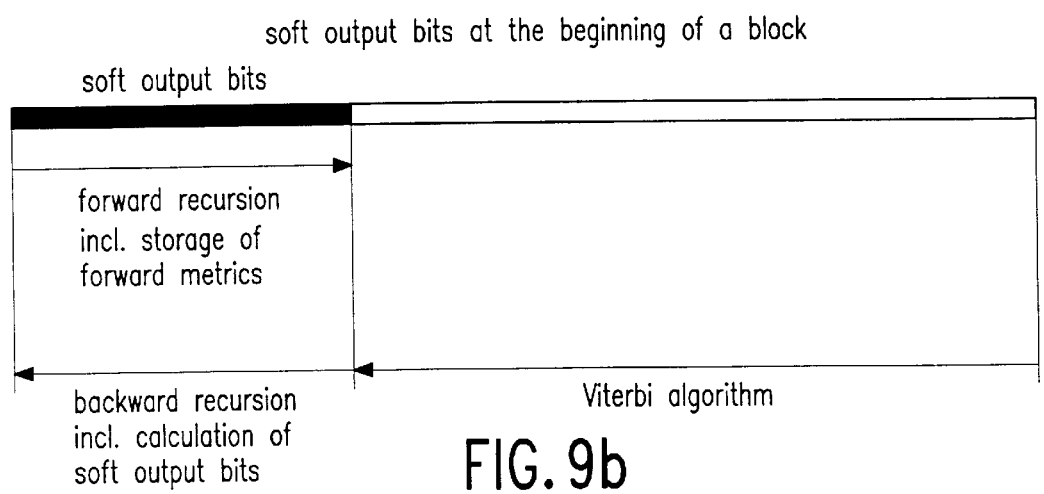
Figure 9C:
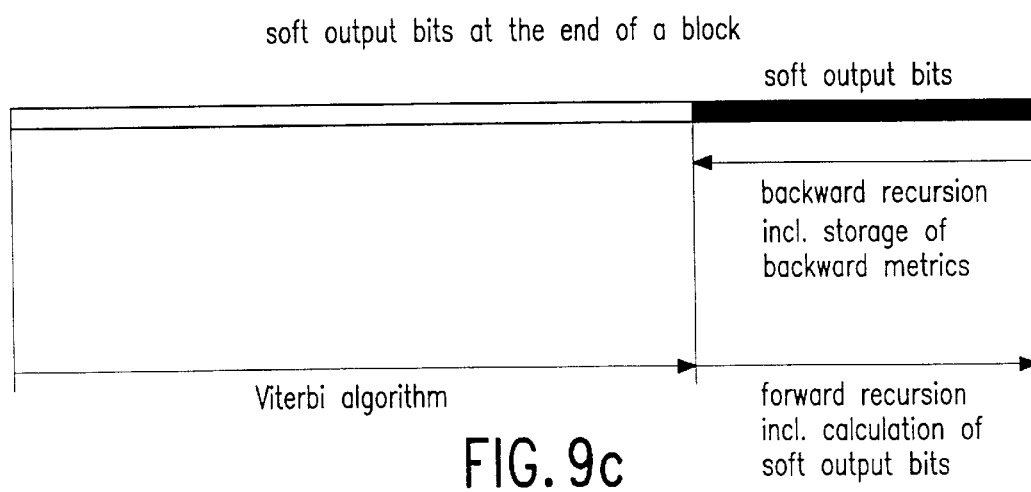

FIGS. 6 and 7 illustrate the degradation of the soft-output values with incomplete soft-output decoding as a function of the advance if the backward recursion, for example for the front part, starts in the middle of the block. In FIG. 6 $\Delta\bar{q}$ represents the deviation of the soft-output values between incomplete and complete soft-output decoding. It shows the probability that the deviation $\Delta\bar{q}$ lies within a range of $\pm\delta$ in dependence on the advance of the backward recursion. The average soft-output value is here 12.44. The lower curve ($\delta=\pm 0.1$) quasi represents the case where the soft-output values correspond to each other.

FIG. 7 is based on a system with an external repetition code and an internal convolutional code with soft-output decoding, in which a multiplex scheme provides that the output bits of the repetition decoder always occupy the bit position in the code word of the internal convolutional decoder in which a soft-output decoding starts. For this arrangement FIG. 7 shows the position-dependent BER according to the repetition decoder (soft-output majority decision) in dependence on the advance for the backward recursion.

The exact symbol-by-symbol MAP algorithm is basically unsuitable for fixed point DSP's due to numerical problems. Conversely, the sub-optimum variant represents an efficient soft-output algorithm which is primarily suitable for signal sequences with a block structure. The version with reduced memory locations allows an implementation of the algorithm in currently available standard DSPs, for moderate block lengths of up to several hundred bits. Furthermore, the combined use with the conventional Viterbi algorithm is possible if soft-output values are necessary only for a part of the block, to save on further memory requirements and computational efforts.

The foregoing merely illustrates the principles of the invention. It will thus be appreciated that those skilled in the art will be able to devise various arrangements which, although not explicitly described or shown herein, embody the principles of the invention and are thus within its spirit and scope.

I claim:

1. A digital transmission system comprising:
a transmitting device including a coding device for coding a digital transmit signal, comprising at least a transmit channel for transmitting the coded digital signal and comprising a decoding device for forming a decoded digital signal via an estimate assigned to the respective symbols of the decoded digital signal for the probability with which the respective symbol was sent, forward state metrics and backward state metrics to be stored being used for calculating the estimates,
wherein the backward state metrics are stored only in each $L^{th}$ step, where L is the influence length of the convolutional code used in the decoding device.

2. A digital transmission system comprising:
a transmitting device including a coding device for coding a digital transmit signal, comprising at least a transmit channel for transmitting the coded digital signal and comprising a decoding device for forming a decoded digital signal via an estimate assigned to the respective symbols of the decoded digital signal for the probability with which the respective symbol was sent, forward state metrics and backward state metrics to be stored being used for calculating the estimates,
wherein the backward state metrics are stored only in each $L^{th}$ step, where L is the influence length of the convolutional code used in the decoding device,
wherein a combination of the symbol-by-symbol Maximum A posteriori Probability (MAP) algorithm and the Viterbi algorithm is made such that soft-output values are calculated only for the most significant bits of the decoded digital signal.

3. A digital transmission system comprising a transmitting device including a coding device for coding a digital transmit signal, comprising at least a transmit channel for transmitting the coded digital signal and comprising a decoding device for forming a decoded digital signal via an estimate assigned to the respective symbols of the decoded digital signal for the probability with which the respective symbol was sent, forward state metrics and backward state metrics to be stored being used for calculating the estimates, wherein the backward state metrics are stored only in each $L^{th}$ step, where L is the influence length of the convolutional code used in the decoding device, wherein at the start of the backward recursion the start metric of the state that is to be passed through obtains the zero value whereas all the other state metrics obtain a large negative value.

4. A digital transmission system comprising:

a transmitting device including a coding device for coding a digital transmit signal, comprising at least a transmit channel for transmitting the coded digital signal and comprising a decoding device for forming a decoded digital signal via an estimate assigned to the respective symbols of the decoded digital signal for the probability with which the respective symbol was sent, forward state metrics and backward state metrics to be stored being used for calculating the estimates, wherein the backward state metrics are stored only in each $L^{th}$ step, where L is the influence length of the convolutional code used in the decoding device, wherein the most significant bits of the transmit signal occur both at the beginning and at the end of a block and in that the backward recursion is limited to the front and back part of the block.

5. A digital transmission system comprising:

a transmitting device including a coding device for coding a digital transmit signal, comprising at least a transmit channel for transmitting the coded digital signal and comprising a decoding device for forming a decoded digital signal via an estimate assigned to the respective symbols of the decoded digital signal for the probability with which the respective symbol was sent, forward state metrics and backward state metrics to be stored being used for calculating the estimates, wherein the backward state metrics are stored only in each $L^{th}$ step, where L is the influence length of the convolutional code used in the decoding device, wherein, as a result of the respective summation in step n+1, the soft-output value is calculated both for the current symbol $x_{n+1}$ and for the preceding symbol $x_n$.

6. A digital transmission system comprising:

a transmitting device including a coding device for coding a digital transmit signal, comprising at least a transmit channel for transmitting the coded digital signal and comprising a decoding device for forming a decoded digital signal via an estimate assigned to the respective symbols of the decoded digital signal for the probability with which the respective symbol was sent, forward state metrics and backward state metrics to be stored being used for calculating the estimates, wherein the backward state metrics are stored only in each $l^{th}$ step, where L is the influence length of the convolutional code used in the decoding device, wherein as a result of the respective summation in step n+1 the soft-output value is calculated both for the current symbol $x'_{n+1}$ and for the preceding symbol $x_n$, while there is a generalization for the L-2 previous symbols.

7. A radio station comprising;

a decoding device for forming a decoded digital signal from a received signal via an estimate assigned to the respective symbols of the decoded digital signal for the probability with which the respective symbol was sent, forward state metrics and backward state metrics to be stored being used for calculating the estimates, wherein the decoding device comprises means for storing the backward state metrics only in each $L^{th}$ step, where L is the influence length of the convolutional code used in the decoding device.

8. A radio station comprising:

a decoding device for forming a decoded digital signal from a received signal via an estimate assigned to the respective symbols of the decoded digital signal for the probability with which the respective symbol was sent, forward state metrics and backward state metrics to be stored being used for calculating the estimates, wherein the decoding device comprises means for storing the backward state metrics only in each $L^{th}$ step, where L is the influence length of the convolutional code used in the decoding device, wherein a combination of the symbol-by-symbol Maximum A posteriori Probability (MAP) algorithm and the Viterbi algorithm is used so that the soft-output values are calculated only for the most significant bits of the decoded digital signal.

9. A radio station comprising:

a decoding device for forming a decoded digital signal from a received signal via an estimate assigned to the respective symbols of the decoded digital signal for the probability with which the respective symbol was sent, forward state metrics and backward state metrics to be stored being used for calculating the estimates, wherein the decoding device comprises means for storing the backward state metrics only in each $L^{th}$ step, where L is the influence length of the convolutional code used in the decoding device, wherein, at the start of the backward recursion, the start metric of the state that is to be passed through obtains the zero value whereas all the other state metrics obtain a large negative value.

10. A radio station comprising:

a decoding device for forming a decoded digital signal from a received signal via an estimate assigned to the respective symbols of the decoded digital signal for the probability with which the respective symbol was sent, forward state metrics and backward state metrics to be stored being used for calculating the estimates, wherein the decoding device comprises means for storing the backward state metrics only in each $L^{th}$ step, where L is the influence length of the convolutional code used in the decoding device, wherein the most significant bits of the transmit signal occur both at the beginning and at the end of a block and in that the backward recursion is limited to the front and back part of the block.

11. A radio station comprising:

a decoding device for forming a decoded digital signal from a received signal via an estimate assigned to the respective symbols of the decoded digital signal for the probability with which the respective symbol was sent, forward state metrics and backward state metrics to be stored being used for calculating the estimates, wherein the decoding device comprises means for storing the backward state metrics only in each $L^{th}$ step, where L is the influence length of the convolutional code used in the decoding device.

wherein as a result of the respective summation in step n+1 the soft-output value is calculated both for the current symbol and for the preceding symbol.

12. The digital transmission system according to claim 1, wherein a combination of a first algorithm and the Viterbi algorithm is made such that soft-output values are calculated only for selected bits of the decoded digital signal.

13. The digital transmission system according to claim 1, wherein at the start of the backward recursion the start metric of the state that is to be passed through obtains a first value, whereas all other state metrics obtain a predetermined value.

14. The radio station according to claim 7, wherein a combination of a first algorithm and the Viterbi algorithm is made such that soft-output values are calculated only for selected bits of the decoded digital signal.

15. The radio station according to claim 7, wherein at the start of the backward recursion the start metric of the state that is to be passed through obtains a first value, whereas all other state metrics obtain a predetermined value.

* * * * *